( 12 ) United States Patent
Sugimoto (10) Patent No.: US 9,034,461 B2
(45) Date of Patent: May 19, 2015

(54) HARD FILM SLIDING PART AND METHOD OF MANUFACTURING THE SLIDING PART

(71) Applicant: HITACHI, LTD., Tokyo (JP)

(72) Inventor: Itto Sugimoto, Hitachi (JP)

(73) Assignee: HITACHI, LTD., Tokyo (JP)

( * ) Notice: Subject to any disclaimer, the term of this patent is extended or adjusted under 35 U.S.C. 154(b) by 74 days.

(21) Appl. No.: 13/765,254

(22) Filed: Feb. 12, 2013

(65) Prior Publication Data

US 2013/0251956 A1 Sep. 26, 2013

(30) Foreign Application Priority Data

Mar. 23, 2012 (JP) ................................. 2012-066503

(51) Int. Cl.
| | |
|---|---|
| *B32B 3/30* | (2006.01) |
| *B32B 7/02* | (2006.01) |
| *B23B 3/30* | (2006.01) |
| *C23C 14/35* | (2006.01) |
| *C23C 14/02* | (2006.01) |
| *C23C 14/06* | (2006.01) |
| *C23C 14/34* | (2006.01) |

(52) U.S. Cl.
CPC . *B23B 3/30* (2013.01); *C23C 14/35* (2013.01); *C23C 14/027* (2013.01); *C23C 14/0635* (2013.01); *C23C 14/0664* (2013.01); *C23C 14/345* (2013.01); *C23C 14/352* (2013.01)

(58) Field of Classification Search
CPC .... C23C 14/025; C23C 14/027; C23C 14/04; C23C 14/042; C23C 14/0605; C23C 14/0641; C23C 14/0647; C23C 14/0658; C23C 14/0664; C23C 14/067; C23C 14/14; C23C 14/16; C23C 14/165; C23C 16/0272; C23C 16/0281; C23C 16/029; C23C 16/04; C23C 16/042; C23C 16/22; C23C 16/26; C23C 16/28
USPC ......... 428/102, 103, 119, 141, 143, 148, 156, 428/163, 164, 167, 168, 172, 195.1, 206, 428/209, 212, 217; 384/276, 283, 291–293
See application file for complete search history.

(56) References Cited

U.S. PATENT DOCUMENTS

| 4,495,006 | A | * | 1/1985 | Aves et al. ..................... 148/217 |
| 5,462,362 | A | * | 10/1995 | Yuhta et al. ..................... 384/13 |
| 5,928,771 | A | | 7/1999 | DeWald, Jr. et al. |

(Continued)

FOREIGN PATENT DOCUMENTS

| CN | 101525734 A | 9/2009 |
| JP | 06-041721 A | 2/1994 |

(Continued)

*Primary Examiner* — Aaron Austin
*Assistant Examiner* — Megha Mehta
(74) *Attorney, Agent, or Firm* — Volpe and Koenig, P.C.

(57) ABSTRACT

Disclosed herein is a hard film containing boron and carbon, wherein the hard film includes a plurality of concave portions and a plurality of convex portions formed on a surface of the hard film, and wherein carbon concentration in the concave portion is higher than that in the convex portion and boron concentration in the convex portion is higher than that in the concave portion. Further, disclosed herein is a method of manufacturing a sliding part having a hard film containing boron and carbon disposed over a substrate; wherein the hard film is manufactured by using at least one of an unbalanced magnetron sputtering method or a high power pulsed magnetron sputtering method, both sputtering methods using a target containing at least one of elements of silicon, chromium, titanium, and tungsten and a boron carbide target.

12 Claims, 3 Drawing Sheets

(56) References Cited

U.S. PATENT DOCUMENTS

| | | | |
|---|---|---|---|
| 6,736,101 B2 | 5/2004 | Kano et al. | |
| 2011/0021390 A1 | 1/2011 | Mori et al. | |
| 2012/0270064 A1 | 10/2012 | Okamoto et al. | |

FOREIGN PATENT DOCUMENTS

| | | | |
|---|---|---|---|
| JP | 11-505572 A | 5/1999 |
| JP | 2002-235852 A | 8/2002 |
| JP | 2004-060668 A | 2/2004 |
| JP | 2005-282668 A | 10/2005 |
| JP | 2007-099949 A | 4/2007 |
| JP | 2011-026591 A | 2/2011 |
| JP | 2011-052238 A | 3/2011 |
| JP | 2011-246792 A | 12/2011 |
| JP | 2012-097821 A | 5/2012 |
| JP | 2012-224043 A | 11/2012 |

* cited by examiner

FIG. 6

HARD FILM SLIDING PART AND METHOD OF MANUFACTURING THE SLIDING PART

BACKGROUND OF THE INVENTION

1. Field of the Invention

The present invention relates to a hard film, a sliding part, and a method of manufacturing the sliding part.

2. Description of the Related Art

Techniques for reducing the friction of sliding parts have been intensively studied to contribute to reduction of fuel consumption in internal combustion engines and to improvement in the working life of parts. Their typical examples are development for the solid lubrication films and development of texturing allowing a desired concavo/convex shape to be formed on the surface. Solid lubrication films exhibit satisfactory effects in a circumstance with no lubrication and, in contrast, the texturing, which uses a structure in which lubrication oils are accumulated, effectively functions in a circumstance where the lubrication oils are used.

Further, by combining the techniques described above, a technique in which the solid lubrication film and the texture coexist has been devised. Such a combined technique is applied to a sliding circumstance where the thickness of the oil membrane of the lubrication oil changes or to a lubrication circumstance where the thickness of the oil membrane is thin and a solid contact is innegligible.

A technique of providing a concavo/convex shape to the surface of a film has been developed as in JP-2002-235852-A and JP-H06 (1994)-41721-A. According to JP-2002-235852-A, a film having a plateau shape at the surface prevents oil run out and exhibits a low friction property in a lubrication oil. According to JP-H06 (1994)-41721-A, a hard film having a truncated concavo/convex shape ensures oil retention and thus has anti-galling property and wear resistance.

Meanwhile, DLC (Diamond-like Carbon) is a typical material for a solid lubrication film. DLC is well-known as a film adapted to allow high hardness and self-lubrication property to coexist. DLC is a film which is a material also referred to as amorphous carbon, a-C (amorphous carbon), a-C:H (hydrogenated amorphous carbon), i-C (i-carbon), and hard carbon. The film deposition method of DLC includes a PVD method or a plasma CVD method such as sputtering and arc ion plating, wherein when a hydrocarbon gas is used for the starting material, a carbon film containing hydrogen is formed.

The micro structure of DLC is an amorphous structure including both $sp^2$ bonding and $sp^3$ bonding as bonding of carbon atoms to each other but not having a distinct crystal structure (not having grain boundary). DLC can provide high hardness and high toughness in comparison with a crystalline hard film made of TiN (titanium chloride), TiAlN (titanium aluminum nitride), and CrN (chromium nitride), or the like. DLC has a low friction coefficient since it has self-lubricity derived from the $sp^2$ bonding.

However, DLC suffers from deterioration of film quality such as a decrease in film strength or formation of defects on the surface in a temperature region of 300° C. or higher, with DLC having heat resistant temperature that is remarkably low compared with about 500° C. of TiN and about 800° C. of TiAlN. Since the friction surface is at a high temperature state locally due to heat of friction, DLC may sometimes be worn remarkably depending on the sliding condition.

A film with addition of other elements to DLC has been developed with an aim of improving the wear resistance of DLC and JP-2011-26591-A describes DLC containing 5 to 25 atomic % of hydrogen and 4 to 30 atomic % of boron at the surface of a member used in a lubrication oil.

With an aim of ensuring low friction property in a no-lubrication state, a molybdenum additive is blended to a lubrication oil in JP-2002-235852-A, while sulfur, phosphorus, zinc, calcium, magnesium, sodium, barium, and copper are blended each in an appropriate amount to the lubrication oil in JP-H06 (1994)-41721-A.

Further, with an aim of improving the heat resistance, a film with addition of boron and nitrogen together to DLC has also been developed. According to JP-2004-60668-A, a rolling device are improved in anti-galling property and wear resistance by forming a B—C—N layer comprising amorphous carbon containing boron and nitrogen.

According to JP-2005-282668-A, a fastening jig has a sliding surface coated with a film comprising from 40 atomic % or more to less than 99 atomic % of carbon and from 1 atomic % or more and less than 40 atomic % of hydrogen where carbon is substituted with boron and nitrogen in a range of 10 to 80%. Such a fastening jig exhibits satisfactory anti-galling property.

SUMMARY OF THE INVENTION

However, any of the patent references described above involves problems in terms of durability.

The present invention intends to keep stable low friction properties for a long period of time.

To attain the foregoing purpose, the present invention provides a hard film containing boron and carbon, wherein the hard film includes a plurality of concave portions and a plurality of convex portions formed on a surface of the hard film, and wherein carbon concentration in the concave portion is higher than that in the convex portion and boron concentration in the convex portion is higher than that in the concave portion.

Further, the present invention provides a method of manufacturing a sliding part having a hard film containing boron and carbon disposed over a substrate, wherein the hard film is manufactured by using at least one of an unbalanced magnetron sputtering method or a high power pulsed magnetron sputtering method, both sputtering methods using a target containing at least one of elements of silicon, chromium, titanium, and tungsten and a boron carbide target.

According to the present invention, stable low friction properties can be maintained for a long period of time.

BRIEF DESCRIPTION OF THE DRAWINGS

Other objects and advantages of the invention will become apparent from the following description of embodiments with reference to the accompanying drawings in which.

DESCRIPTION OF PREFERRED EMBODIMENTS (Configuration of Hard Film)

As a method of improving the lubrication property irrespective of ingredients of a lubrication oil, it may be considered to form a desired concavo/convex shape to the surface of a hard film. In this case, it is desirable that the hard film can maintain the surface shape for a long period of time.

Conventionally, when the surface of DLC of low heat resistance with no addition of other elements is textured, DLC exhibits satisfactory low friction properties in the initial stage of sliding movement. However, since the heat of friction becomes large in a convex portion undergoing a locally high surface pressure, wearing proceeds and the surface is flattened with the lapse of sliding time, with the result that the low friction property cannot be maintained.

Further, conventionally, there is a method of forming a concavo/convex shape on the surface of a hard film by disposing a mask to the surface of a substrate during film deposition and removing the mask after film deposition. When such a method is adopted, a boundary between the substrate and the film, or a boundary between the surface layer and an under layer is exposed locally. The exposed boundary cannot endure stress concentration to result in trigger of boundary peeling and damage the film.

The invention can provide a hard film having satisfactory durability against plural film friction loss, and also having a concavo/convex shape suitable for retention of the lubrication oil at the surface.

Figure 1:
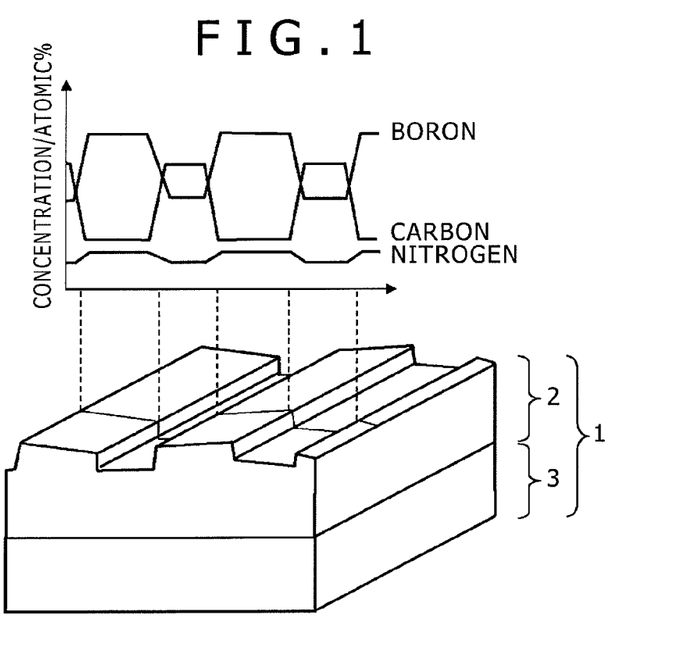
FIG. 1 is a perspective view illustrating concavo/convex portion on the surface of a hard film having grooves and a compositional profiles of boron, carbon, and nitrogen at the surface.

FIG. 1 illustrates a perspective view of a concavo/convex portion at the surface of a hard film and compositional profiles of boron, carbon, and nitrogen (distribution of elements) at the surface. The hard film 2 is an amorphous film at least containing boron and carbon and having a plurality of grooves formed in the uppermost surface layer.

In the cross section in the stacking direction of the hard film 2, concave portions and convex portions are formed each in plurality in the surface of the film, where grooves correspond to the concave portions. According to the feature of the invention, the concentration of carbon is higher in the concave portion than in the convex portion. Thus, a lubrication oil can be retained in the grooves, which can contribute to the low friction properties in the lubrication oil. Further, since the concentration of boron is higher in the convex portion than in the concave portion, the convex portion has higher heat resistance. Accordingly, the hard film 2 has in the convex portion a satisfactory durability against friction, thereby restricting the phenomenon that the surface is planarized due to wear of the convex portion.

That is, according to the invention, the carbon concentration is increased in the concave portion as the groove thereby facilitating to retain the lubrication oil and decreasing the friction coefficient. In contrast, the concentration of boron is increased in the convex portion in sliding contact with a mating member thereby improving the heat resistance and increasing the durability. Accordingly, the concavo/convex shape of the hard film can be maintained for a long period of time to attain stable low friction properties.

More preferably, the hard film 2 according to the invention is an amorphous film containing nitrogen in addition to boron and carbon. Nitrogen tends to be bonded with boron and is at a lower concentration in the concave portion than in the convex portion. Nitrogen maintains an amorphous structure, and does not form crystal grains, etc.

Since the B—N bond maintains high hardness properties and is also thermally stable to contribute to the improvement in the heat resistance, nitrogen is preferably contained at a maximum concentration not exceeding 1.1 times the concentration of boron. However, if nitrogen is contained in excess of the limit, then nitrogen forms many C—N bonds to cause remarkable lowering of the film hardness.

Preferably, the plurality of grooves introduced in the uppermost surface layer of the hard film 2 according to the invention are at random in the longitudinal direction and have an isotropic structure. Since the lubrication oil tends to flow in the longitudinal direction of the groove within the sliding surface, when the grooves are in parallel to each other in the longitudinal direction and extend in one identical direction, sliding movement is less caused in the direction other than the longitudinal direction, where the friction coefficient is increased. That is, the direction of the sliding movement gives an effect on the friction property. By forming the isotropic structure, low friction properties not depending on the direction of the sliding movement can be achieved.

The film hardness of the hard film 2 according to the invention is preferably 20 GPa or more in an instrumented indentation hardness test specified in ISO-14577 under the condition of an indentation depth of 150 nm or less. The hardness below the specified range is not preferred since peeling tends to occur due to the presence of a shearing force during sliding movement.

Preferably the groove introduced into the uppermost surface layer of the hard film 2 of the invention has a size in a range not exceeding 100 μm in the lateral direction perpendicular to the longitudinal direction and the step between the concave portion and the convex portion is within a range not exceeding 0.5 μm. If the width is larger than the range, the size of the contact portion is less than the width due to point contact or line contact and sufficient lubrication effect is less obtainable. Further, if the step between the concave portion and the convex portion is larger than the range described above, shearing resistance is increased due to engagement at the step, resulting in an increase in the friction coefficient.

Figure 2:
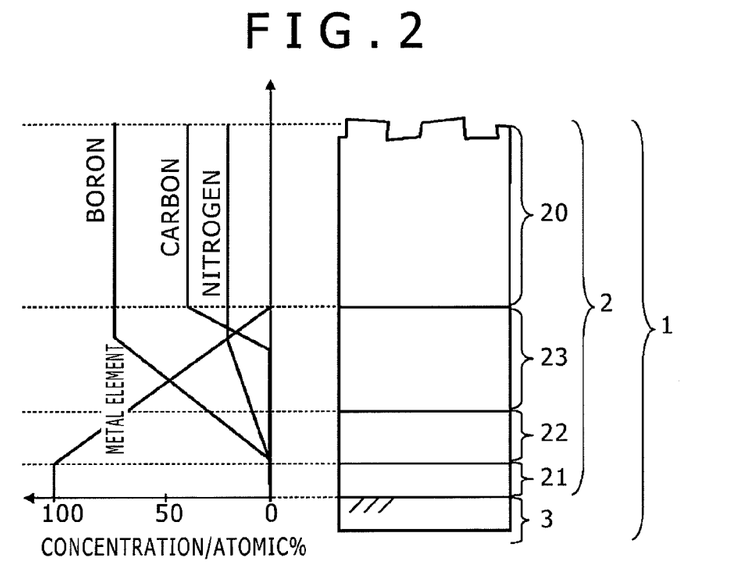
FIG. 2 is a cross sectional view illustrating an embodiment of a hard film and compositional profiles in the direction of the thickness of the hard film.

FIG. 2 illustrates a cross sectional view of an embodiment of a hard film and distribution of elements in the direction of the thickness of the hard film. A composition containing a metal element, boron, carbon, and nitrogen is shown. The hard film 2 according to the invention preferably has a multilayered structure where intermediate layers 21 to 23 are interposed between a hard protective layer 20 and a substrate 3.

In this embodiment, a first intermediate layer 21 comprising a metal is formed just over the substrate 3, a second intermediate layer 22 comprising a metal and a metal carbide boride as a major ingredient is formed just above the first intermediate layer 21, and a third intermediate layer 23 comprising metal carbide boride and amorphous carbon as a major ingredient is formed just over the second interlayer 22.

Preferably, the compositional profiles in the direction of the thickness of the intermediate layers 21 to 23 are changed continuously from the boundary relative to the substrate 3 to the boundary relative to the hard protection layer 20. In other words, the composition in each of the intermediate layers becomes closer to that of an adjacent layer as it approaches the adjacent layer. When such a multi-layer structure is formed, internal stress in the hard film 2 is moderated and adhesion with the substrate 3 is improved, so that peeling at the boundary can be suppressed to further improve the durability.

Preferably, the metal used for the intermediate layers 21 to 23 of the hard film 2 according to the invention is at least one of members of silicon (Si), chromium (Cr), titanium (Ti), and tungsten (W). The elements can form a film to a substrate made of iron and steel or a substrate made of an Al alloy with good adhesion.

The hard film 2 according to the invention may sometimes be incorporated with hydrogen, oxygen, and argon as inevitable elements during manufacture. In this case, it is preferred to control such that hydrogen is 20 atomic % or less, oxygen is 12 atomic % or less, and argon is 15 atomic % or less. It is not preferred that the element exceed the specified range since the film is embrittled tending to cause friction loss of the film during sliding movement.

The hard film according to the invention is preferably formed to the surface of various sliding parts. The sliding part provided within internal combustion engines for automobiles include, for example, a valve lifter, a tappet, an adjusting shim, a cam, a cam shaft, a rocker arm, a piston, a piston pin, a piston ring, a timing gear, and a timing chain. Further, sliding parts provided in fuel supply pumps or fuel injection systems include an injector, a plunger, a cylinder, a cam, and a vane. However, the invention is not restricted to them and applicable generally also to other sliding parts.

(Manufacturing Method)

The hard film according to the invention is preferably manufactured by a PVD method using boron carbide as a solid target by a film manufacturing device utilizing one or both of the techniques of an unbalanced magnetron sputtering technique and a high power pulsed magnetron sputtering technique which is a sputtering technique having a relatively high plasma ionization ratio. When an existent sputtering device is used, since the energy of the plasma is limited and the plasma is mainly excited near the target, it is difficult to keep a highly excited state near the substrate to which the film is to be deposited.

On the contrary, the unbalanced magnetron sputtering technique is a technique capable of controlling the plasma distribution to increase the plasma density on the side of the substrate. Further, the high power pulsed magnetron sputtering technique is a technique capable of improving the energy of the plasma per se on the target. When sputtering is performed by using the device utilizing such techniques, even less ionizing carbon or boron can be excited to a higher level to form an unbalanced state, and form a film having an inherent concavo/convex shape. Usually, argon gas is used for plasma control.

When the compositional ratio between boron and carbon in the hard film according to the invention is controlled, a method of providing two kinds of solid targets of boron carbide and graphite, and controlling the ratio by controlling the power charged to each of them is used preferably. Further, when nitrogen is incorporated, a method of sealing one or both of nitrogen gas and ammonia gas each by a trace amount in a vacuum furnace during film deposition and incorporating the same in the film is used preferably.

When a hard film according to the invention is manufactured, a reaction sputtering method of using hydrogen gas and hydrocarbon gas together may be practiced with an aim of manufacturing a highly hard film by strengthening the reduction reaction of carbon, in which hydrogen in the hard film is controlled preferably to 20 atomic % or less. When methane gas is utilized, the flowing volume of the methane gas is preferably restricted to a small amount with the upper limit being as "Ar:methane=90:10". When the film is formed without incorporating hydrogen by the sputtering method, the hardness of the hard film is higher as the boron concentration is higher and reaches the highest hardness at the highest boron concentration of "boron:carbon=4:1".

On the other hand, when the film is manufactured by incorporating hydrogen at a concentration within a range of 15 atomic % or less, the hardness of the hard film is increased more as the concentration of carbon is higher and the value of the hardness of the hard film is between the film hardness of the existent DLC manufactured only from graphite and that at "boron:carbon=4:1" described above.

EXAMPLES

Example 1

Conditions under which the inherent surface structure is obtained were investigated by using either an unbalanced magnetron sputtering device (hereinafter referred to as UBM sputtering device) or a high power pulsed magnetron sputtering device (hereinafter referred to as HPPM sputtering device) with consideration given to solid targets and gases as a film supply source. Ar was used as gas species for sputtering.

Example 1-1

A substrate, a chromium target, and a boron carbide target were set to an UBM sputtering device (UBMS™ manufactured by Kobe Steel Limited). First, electric power was applied to the chromium target while argon gas is made to flow in the device to deposit a first intermediate layer (0.1 μm thickness) to the surface of a steel substrate. Successively, electric power was additionally applied to the boron carbide target to deposit a second intermediate layer (0.5 μm thickness).

In the film deposition of the second intermediate layer, electric power to the target and the gas flow rate were controlled such that the chromium concentration was decreased gradually and the carbon concentration and the boron concentration were increased gradually. Subsequently, electric power was applied continuously only to the boron carbide target while power applied to the chromium target was interrupted, at a gas pressure in vacuum of 0.2 Pa and at a bias voltage of 150 V to be applied to the substrate, to deposit an amorphous BC film (1.7 μm thickness). The temperature of the specimen during film deposition was increased particularly during radiation of plasma and it was always kept at a level not exceeding 200° C.

An inherent concavo/convex texture was observed at the surface of the film. When the film was put to compositional analysis, the ratio of atomic concentration was that "boron: carbon=82:18" in the convex portion and "boron:carbon=69:31" in the concave portion, and it was confirmed that a desired structure was obtained.

Examples 1-2 to 1-4, Comparative Examples 1-1 to 1-6

Films were formed on the surface of steel substrates using the same method as in Example 1-1 while the types of the solid target and the atmospheric gas were changed. At least one member selected from boron carbide, graphite, boron, and hexagonal boron nitride was used as the solid target used for forming the film in the uppermost surface layer. Nitrogen or methane was optionally selected as the gas to be incorporated into the Ar atmosphere.

Electric power applied to the target and the amount of the gas supplied were controlled such that the content of carbon is substantially equal to that of boron and nitrogen in the film, so that the atomic concentration of carbon is 33 to 68 atomic % with the amount of the three elements assumed as 100.

Since, excess supply of a hydrocarbon gas lowers the hardness of the film, the upper limit of the flowing volume of the methane gas was controlled such that "Ar:methane=90:10". Further, a high frequency power source was used for the power source to be applied to the hexagonal boron nitride as an insulator.

A film having an intrinsic concavo/convex surface was observed in Examples 1-2 to 1-4. By contrast, the inherent concavo/convex surface was not observed in Comparative Examples 1-1 to 1-2 containing boron manufactured by using boron or boron nitride and in Comparative Examples 1-3 to 1-6 manufactured by using a graphite target not using a boron-containing material.

Examples 1-5 to 1-6, Comparative Example 1-7

Films were formed by using the same method as in Example 1-1, where a boron carbide target and a graphite target were used and the temperature of the specimens was changed. In Example 1-5, plasma irradiation was performed not continuously but intermittently so that temperature increase was suppressed. In some cases steel and Al alloys deteriorate at a high temperature treatment, but none of the materials deteriorates when the treatment temperature is controlled to 100° C. or lower.

In Example 1-6 and Comparative Example 1-7, specimens were heated by operating an electric heater during formation of films. As a result, the inherent concavo/convex surface could be achieved in a circumstance where the temperature of the specimen is kept at 560° C. or lower, whereas no desired concavo/convex surface was observed in Comparative Example 1-7 where a film was formed in an atmosphere at a temperature of about 580° C. or higher. Since movement of atoms constituting amorphous is vigorous under the high temperature circumstance and atomic diffusion occurs in a manner that offsets the difference of concentration, the concavo/convex shape having different concentration will not be formed.

Examples 1-7 to 1-8, Comparative Examples 1-8 to 1-9

Films were formed by the same method as in Example 1-1, where a boron carbide target and the graphite target were used and the bias voltage applied to the substrate was changed. As a result, an inherent concavo/convex surface could be achieved when films were deposited under the condition of an application bias voltage of 30 V to 340 V in a circumstance where the inherent temperature was kept at 560° C. or lower. However, no desired concavo/convex surface was formed in Comparative Example 1-8 under the condition of an application bias voltage of 20 V and in Comparative Example 1-9 under the condition of an application bias voltage of 350 V.

Example 1-9

A substrate, a chromium target, a boron carbide target and a graphite target were set to an HPPM sputtering device (Flexicoat® 850 manufactured by Hauzer Co.). First, electric power was applied to the chromium target while argon gas is made to flow in the device to deposit a first intermediate layer (0.2 μm thickness) to the surface of a steel substrate. Subsequently, electric power was applied continuously only to the boron carbide target, while the power applied to the chromium target was interrupted, at a gas pressure in vacuum of 0.2 Pa and at a bias voltage of 150 V applied to the substrate to deposit an amorphous BC film (1.8 μm thickness).

The temperature of the specimen during film deposition increased particularly during plasma irradiation, and the temperature was always kept at a level not exceeding 350° C. An inherent concavo/convex texture was observed at the surface of the film. When the film was subjected to compositional analysis, the atomic concentration ratio was that "boron:carbon=75:25" in the convex portion and "boron:carbon=54:46" in the concave portion and it was confirmed that a desired structure was obtained.

(Analysis for Inherent Concavo/Convex Surface)

A boron carbide solid target was provided. A great number of deposition films were trially manufactured using one of UBM sputtering method or HPPM sputtering method, which is capable of generating high energy plasma. As a result, it was confirmed that inherent films shown below can be achieved under predetermined film deposition conditions.

Electron diffraction pattern created by a transmission electron microscope (TEM) revealed that the manufactured hard films are amorphous showing a halo pattern while X-ray photoelectron spectroscopy (XPS) revealed that the manufactured hard films are films containing at least boron and carbon. On the surface of the film observed by atomic force microscopy (AFM) (FIG. 3A), a cluster structure of about several tens μm could be confirmed and a plurality of grooves each having about several μm of width were arranged side inside of the cluster.

Figure 3A:
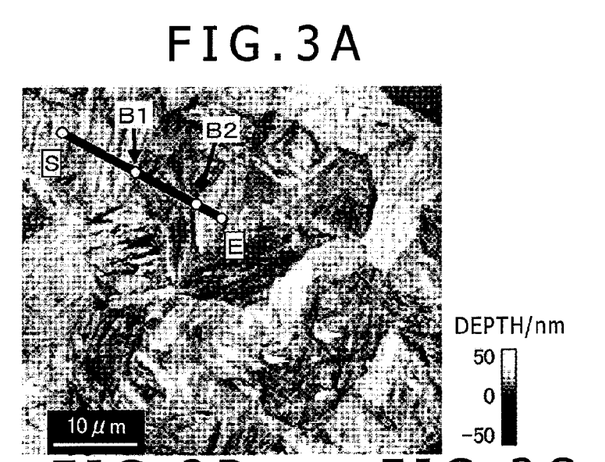
FIG. 3A illustrates an image for the surface in Example 1-3 observed under AFM.
Figure 3B:
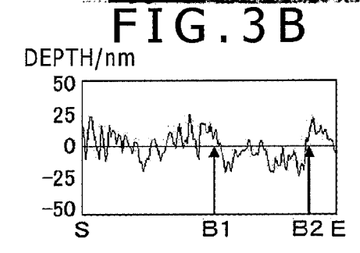
FIG. 3B is a cross sectional concavo/convex profile.
Figure 3C:
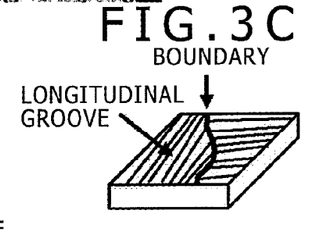
FIG. 3C is a schematic view of the surface.

In this structure, adjacent grooves inside one cluster are oriented in the longitudinal direction to some extent, whereas in comparison between adjacent clusters, grooves are not oriented orderly and the grooves are oriented at random with respect to the longitudinal direction for the entire film. The step of the groove is several tens nm and the step at the boundary of the clusters is also about several tens nm. With reference to the observed image, a cluster structure and grooves introduced in the cluster can be confirmed. In the line profile from the starting point "S" to the end point "E" in the image, a step is formed at the groove portion. B1 and B2 each represent a boundary between adjacent clusters in which the step is not substantially different from that of the groove portion.

Figure 4:
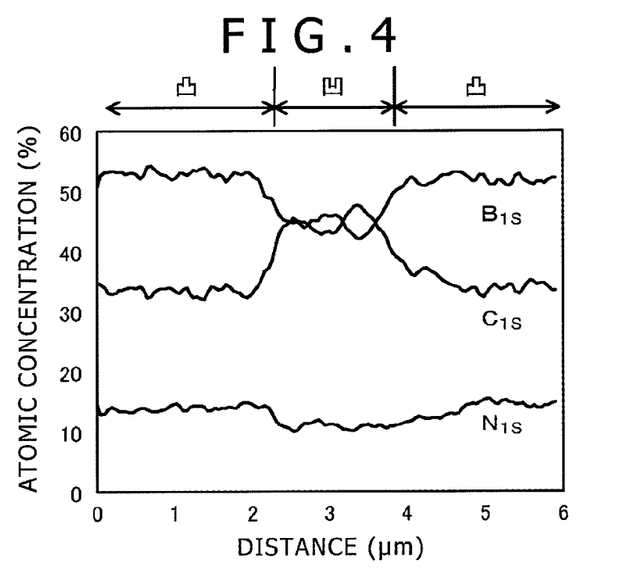
FIG. 4 is a graph illustrating compositional profiles in the concavo/convex portion at the surface of Example 1-3.

The compositional change in the longitudinal groove portion of several μm width was examined by a profile analysis of auger electron spectroscopy (AES). As a result, it was found that higher carbon concentration was exhibited in the concave portion than in the convex portion (FIG. 4). Films with increased carbon content were manufactured by using two kinds of solid targets, that is, a boron carbide target and a graphite target together. In this case, it could be confirmed that the texture of the longitudinal grooves could be formed in the composition not only on the boron-rich area but also on the carbon-rich area. However, the grooved structure was not formed for the amorphous carbon manufactured only from graphite, and the longitudinal groove structure was not formed also in the B—C base amorphous film manufactured from boron and boron nitride (h-BN) as the starting material, which suggests that this texture is derived from boron carbide. The surface concavo/convex shape of the hard film can be analyzed by an atomic force microscopy (AFM) or a laser microscopy, and the composition and the micro structure can be analyzed, for example, by Raman spectroscopy, infrared spectroscopy (IR), transmission electron microscopy (TEM), electron energy loss spectroscopy (EELS), X-ray diffractiometry (XRD), electron diffractiometry (LEED/RHEED), X-ray photoelectron spectroscopy (XPS), and nuclear magnetic resonance (NMR).

The atomic concentration in the film was analyzed by XPS or AES and the ratios for each of three elements, i.e., boron, carbon, and nitrogen were described. Since hydrogen cannot be detected by XPS or AES, it was excluded from the analysis, but it was confirmed that the hydrogen concentration does not exceed 20 atomic % in all of the films formed in the examples based on compositional analysis according to elastic recoil detection analysis (ERDA). Incorporation of hydrogen in excess of the range described above is not preferred since the hardness of the film is lowered. Further, oxygen and argon as inevitable elements in terms of manufacture are mixed in some films but oxygen could be controlled to 12 atomic % or less and argon could be controlled to 15 atomic %. Incorporation of them in excess of the range described above is not preferred since the hardness of the film is lowered.

(Mechanism for Formation of Concavo/Convex Surface Derived from Boron Carbide)

A crystal of boron carbide having $B_4C$ as a basic composition is a rhombohedral crystal and a unit cell thereof has a basic structure of $B_{12}\equiv C_3$ comprising 20 hedrons each having 12 boron atoms and three chained carbon atoms, in which the 20 hedrons are bonded by the chained CCC. The structure in which the carbon atom at the center of the chained CCC is replaced with a boron atom in view of the partial structure is stable and this is a molecular solid represented by the structural formula;

$(B_{11}C)\equiv CBC\equiv (B_{11}C)$.

In general molecular solids, most of materials have low melting point and low hardness since the inter molecular force is smaller than the intra-molecular bonding force. In contrast, boron carbide is a material having outstandingly high melting point and high hardness since the inter-molecular bonding force is large. According to the B—C base phase diagram describing the thermal equilibrium state, boron carbide is present in the mono-phase state of boron carbide $B_4C$ in a compositional range of 9 to 19 atomic % of carbon and present in the two phase state of $B_4C$ and graphite in a compositional range of 19 atomic % or more of carbon.

On the other hand, solids comprising boron, carbon, nitrogen, and silicon, which are adjacent in the periodical table around carbon in the group IV, belong to a material system tending to form homogeneous amorphous showing slow critical cooling rate in crystallization and having no crystal grain boundary. Accordingly, when a material is prepared in a low temperature circumstance while restricting the reaction rate by utilizing unbalanced plasma in vacuum, a micro structure in a state greatly different from the thermal equilibrium state can be expected.

Although the mechanism for formation of the inherent film structure derived from boron carbide has not yet been apparent, it may be assumed as below. As a result of loss of regularity at the bonding level of individual atoms due to the amorphous structure, an effect to form a loose assembly at a larger molecular level prevails.

Since boron carbide which is a molecular bonding material is used as a vapor deposition source, an assembly is formed such that the molecular structures are connected with plural nuclei as base points, and the stress of the film and the size of the assembly are balanced. Thus the cluster structure observed will be formed.

It is considered that since, in the cluster consisting of the molecular assembly, boron atoms tend to be taken into the 20 hedral structure and carbon atoms tend to be taken into the chained CBC site, a portion where the carbon atoms are agglomerated at high concentration due to the anisotropy of the molecular structure forms the groove shape. Such phenomenon may possibly occur also in other molecular solids. However, it can be said that the boron carbide has a feature in, which the inter-molecular force is stronger than the intra-molecular bonding force compared with other materials and this is a material that is further likely to form the molecular assembly.

TABLE 1

| Section | Device | Target | Gas | Temperature/ °C. | Bias/V | BCN concentration ratio (convex portion) | Presence or absence of inherent concavo/convex shape |
|---|---|---|---|---|---|---|---|
| Example 1-1 | UBM sputtering device | $B_4C$ | Ar | <200 | 150 | $B_{0.82}C_{0.18}$ | presence |
| Example 1-2 | UBM sputtering device | $B_4C$ graphite | Ar | <200 | 150 | $B_{0.32}C_{0.68}$ | presence, |
| Example 1-3 | UBM sputtering device | $B_4C$ graphite | Ar nitrogen | <200 | 150 | $B_{0.54}C_{0.33}N_{0.13}$ | presence |
| Example 1-4 | UBM sputtering device | $B_4C$ graphite | Ar nitrogen methane | <200 | 150 | $B_{0.18}C_{0.65}N_{0.17}$ | presence |
| Comp. Example 1-1 | UBM sputtering device | B graphite | Ar | <200 | 150 | $B_{0.58}C_{0.42}$ | absence |
| Comp. Example 1-2 | UBM sputtering device | h-BN graphite | Ar | <200 | 150 | $B_{0.32}C_{0.36}N_{0.32}$ | absence |
| Comp. Example 1-3 | UBM sputtering device | graphite | Ar | <200 | 150 | $C_{1.0}$ | absence |
| Comp. Example 1-4 | UBM sputtering device | graphite | Ar methane | <200 | 150 | $C_{1.0}$ | absence |
| Comp. Example 1-5 | UBM sputtering device | graphite | Ar nitrogen | <200 | 150 | $C_{0.75}N_{0.25}$ | absence |
| Comp. Example 1-6 | UBM sputtering device | graphite | Ar nitrogen methane | <200 | 150 | $C_{0.91}N_{0.09}$ | absence |

TABLE 1-continued

| Section | Device | Target | Gas | Temperature/ °C. | Bias/V | BCN concentration ratio (convex portion) | Presence or absence of inherent concavo/convex shape |
|---|---|---|---|---|---|---|---|
| Example 1-5 | UBM sputtering device | B$_4$C graphite | Ar | <90 | 150 | B$_{0.61}$C$_{0.39}$ | presence |
| Example 1-6 | UBM sputtering device | B$_4$C graphite | Ar | <560 | 150 | B$_{0.69}$C$_{0.31}$ | presence |
| Comp. Example 1-7 | UBM sputtering device | B$_4$C graphite | Ar | <580 | 150 | B$_{0.69}$C$_{0.31}$ | absence |
| Example 1-7 | UBM sputtering device | B$_4$C graphite | Ar | <200 | 30 | B$_{0.65}$C$_{0.35}$ | presence |
| Example 1-8 | UBM sputtering device | B$_4$C graphite | Ar | <200 | 340 | B$_{0.69}$C$_{0.31}$ | presence |
| Comp. Example 1-8 | UBM sputtering device | B$_4$C graphite | Ar | <200 | 20 | B$_{0.65}$C$_{0.35}$ | absence |
| Comp. Example 1-9 | UBM sputtering device | B$_4$C graphite | Ar | <200 | 350 | B$_{0.69}$C$_{0.31}$ | absence |
| Example 1-9 | HPPM sputtering device | B$_4$C graphite | Ar | <350 | 150 | B$_{0.32}$C$_{0.68}$ | presence |
| Comp. Example 1-10 | HPPM sputtering device | B graphite | Ar | <350 | 150 | B$_{0.45}$C$_{0.55}$ | absence |
| Comp. Example 1-11 | HPPM sputtering device | h-BN graphite | Ar | <350 | 150 | B$_{0.44}$C$_{0.12}$N$_{0.44}$ | absence |

Example 2

A plurality of films of varied compositions were formed by utilizing the UBM sputtering device and using boron carbide as a supply source of boron, and relation with respect to the film hardness was investigated. The film hardness was measured by use of an instrumented indentation hardness test (ENT-110a, manufactured by Elionix Co.) while setting an indentation load such that the indentation depth is within a range of 10 to 150 nm. Further, a friction wear test in a lubrication oil was performed and friction coefficient and friction loss of the films were investigated.

Manufacture for Example 2-1 to Example 2-23

Films were formed on the surface of steel substrates by using the same method as in Example 1-1 while the types of the solid target and the atmospheric gas were changed. At least one member selected from boron carbide, graphite, boron, and hexagonal boron nitride was used as the solid target used for forming the film in the uppermost surface layer. Nitrogen or methane was optionally selected as the gas to be incorporated into the Ar atmosphere.

During formation of the surface layer, the gas pressure in vacuum was set to 0.2 Pa, the bias voltage applied to the substrate was set to 150 V and the temperature of the specimen was set to 200° C. For the specimen using methane gas, the flowing volume of the methane gas was controlled such that "Ar:methane=97:3".

Manufacture for Comparative Example 2-1 to Comparative Example 2-4

Films were formed on the surface of steel substrates by using the same method as in Example 1-1 while the types of the solid target and the atmospheric gas were changed. A C film was formed by using a graphite target in Comparative Example 2-1, a CH film was formed by using a graphite target and a methane gas in Comparative Example 2-2, a BC film was formed by using a boron target and a graphite target in Comparative Example 2-3, and a BCN film was formed by using a hexagonal boron target and a graphite target in Comparative Example 2-4. Upon formation of the surface layer, the gas pressure in vacuum was set to 0.2 Pa, the bias voltage applied to the substrate was set to 150 V, and the temperature of the specimen was set to 200° C. In Comparative Example 2-2, the flowing volume of the methane gas was controlled such that "Ar:methane=97:3".

(Friction Wear Test)

Figure 5:
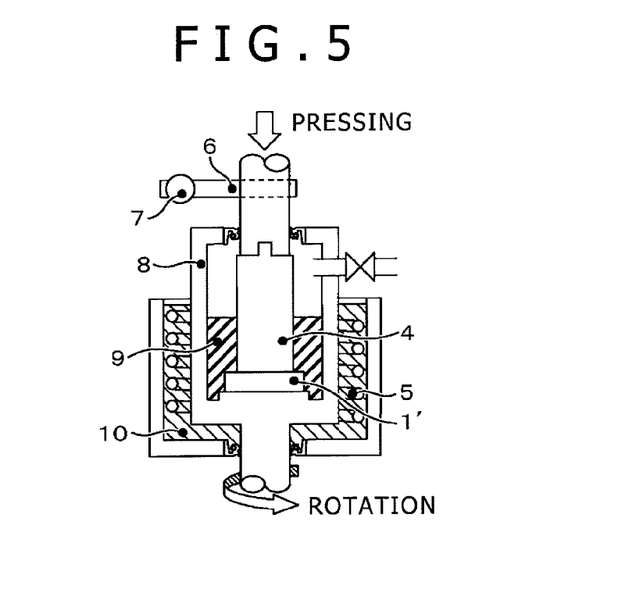
FIG. 5 is a cross sectional schematic view illustrating a friction wear test device.

A Matsubara friction wear tester (model: EFM-III, manufactured by ORIENTEC Co., Ltd.) was used for a friction wear test under boundary lubrication (FIG. 5).

The friction wear testing device includes a plate specimen 1', a ring test piece 4, a heating heater 5, a torque measuring arm 6, a load cell 7, a bath 8; an immersion liquid 9, and a heat insulation oil 10. For a plate test specimen of 3 mm width and 20 mm length, an iron and steel material of SUS 440B was used as a substrate and various kinds of films were formed on the surface of the plate specimen serving as a sliding surface. For a ring specimen of 5.5 mm outer diameter and 3.5 mm inner diameter, a steel material (SKD10) whose surface was subjected to gas nitridation was used, with the steel material serving as a mating member in sliding movement. A poly α-olefin was used as a dipping liquid, which was filled in a bath.

The friction wear test was performed as follows. The specimens were in contact with each other under a load of 3.6 kg (including 2.6 kg corresponding to self weight of jigs) with respect to the ring specimen. The plate specimen was rotated such that the peripheral speed at the outer periphery of the sliding part was 1.0 m/s. The load was applied so as to increase by 1 kgf on every one minute from 3.6 kg to 22.6 kgf. This was maintained for 10 hours ($5.2 \times 10^5$ cycles). Further, the test temperature of a heat insulation oil was measured, in which the heater was used such that the test temperature is controlled to 80° C. The friction coefficient was compared with respect to values taken during 10 hours after setting just before the completion of the test. After the test, the film of the plate specimen was observed to investigate the presence or absence of friction loss.

In the sliding test for surface contact, the thickness t of the oil membrane of the lubricating oil can be approximated as;

$$t = \eta \times v \times a / \mu \times P \quad \text{Formula 1}$$

where η represents a viscosity of the lubricating oil, v represents a velocity, a represents an apparent contact area, μ represents a friction coefficient, and p represents a load.

The viscosity was: $\eta=1.60\times10^{-3}$ Pa·s at an oil temperature of 100° C., whereas the viscosity was: $\eta=5.11\times10^{-3}$ Pa·s at an oil temperature of 40° C. If v=1.0 m/s, a=$1.22\times10^{-5}$ m$^2$ and μ=0.15 as the typical friction coefficient are substituted in the formula (1) respectively, it can be seen that the thickness t of the oil membrane when the oil temperature is set to 90° C. is within a range of $5.9\times10^{-10}$ m<t<$1.8\times10^{-9}$ mm. The step of the longitudinal groove formed in the surface of the film of the example is several tens nm ($10^{-8}$ m or less) which is larger than the thickness of the oil membrane in Comparative Example 1 and thereby improvement in the lubrication performance can be expected by retaining the lubrication oil.

Figure 6:
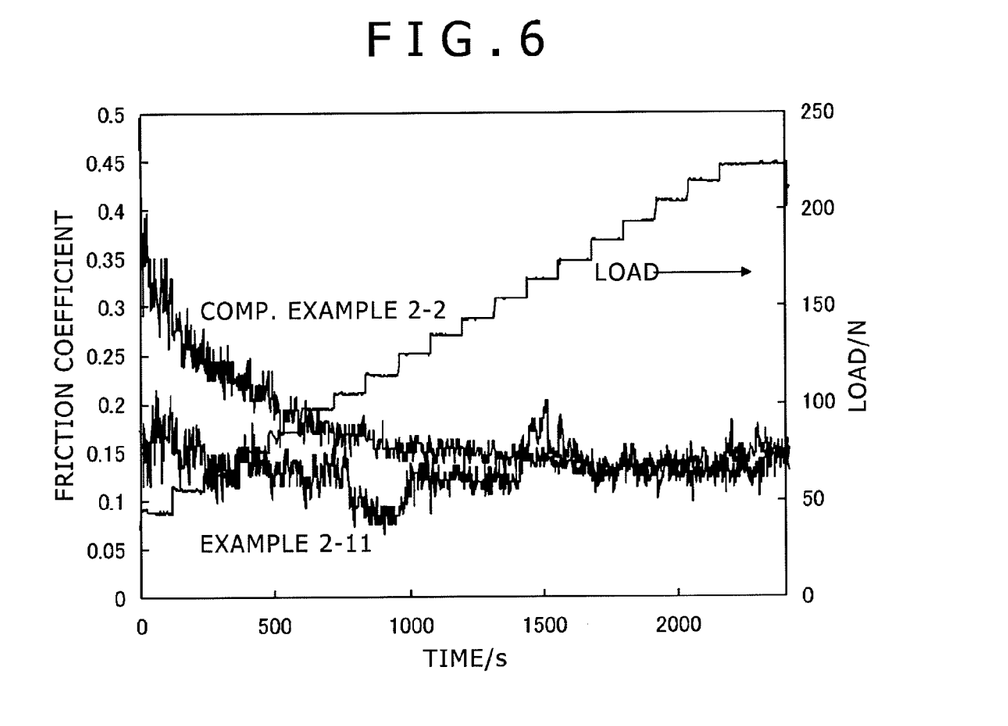
FIG. 6 illustrates a graph showing the change of friction coefficient in Example 2-11 and Comparative Example 2-2 when a load is increased in a friction wear test.

In FIG. 6, the friction coefficient was compared between Example 2-11 and Comparative Example 2-2 when the load was increased. The friction coefficient in Comparative Example 2-2 exhibited 0.35 just after sliding movement, and decreased to 0.14 after the load was increased to a pressure of 22.6 kgJ. However, the friction coefficient was increased up to 0.21 after holding for 10 hours with the lapse of the sliding time.

By contrast, the friction coefficient in Example 2-11 exhibited 0.15 at the initial stage, which showed a relatively low friction. Even under the load of 22.6 kgJ, ° the friction coefficient exhibited 0.14 as small as 0.15 at the initial stage. A stable friction coefficient was exhibited also after holding for 10 hours.

In DLC of Comparative Example 2-2, friction can be lowered at the initial stage by abrading the sliding surface so as to be flat but the underlayer is exposed along with the progress of wear and the friction coefficient is increased after 10 hours. By contrast, the BCNH film of Example 2-11 exhibited stable low friction properties due to the effect of the texture even after it was maintained for 10 hours from the state of the low load. After the test no friction loss was confirmed at the surface of the BCNH film.

It can be seen that the BC film and BCN film each have a higher film hardness on the side where the boron concentration is high, whereas the BCH film and the BCNH film each have a higher film hardness on the side where the carbon concentration is high. It is considered that the methane gas intruded into the furnace upon manufacture of the BCH film and the BCNH film comprises carbon atoms having the same sp$^3$ electron orbital as that of diamond and that the methane gas is bonded with carbon atoms supplied from graphite to form a lattice of high hardness.

Comparative Examples 2-1 to 2-4 exhibited high friction coefficient after films were maintained for 10 hours while wearing of the films was confirmed, whereas each of Examples 2-1 to 2-23 showed satisfactory low friction properties. However, after the test local film peeling was observed in Examples 2-4, 2-5, 2-6, 2-16, and 2-17 in which the film hardness was 19 GPa or less. From this, it is more preferable that films have a film hardness of 20 GPa or more.

TABLE 2

| Section | Major element | Atomic concentration ratio of BCN | | Film hardness/ GPa | Friction coefficient | Film friction loss |
|---|---|---|---|---|---|---|
| | | Convex portion | Concave portion | | | |
| Example 2-1 | BC | $B_{0.82}C_{0.18}$ | $B_{0.69}C_{0.31}$ | 35 | 0.14 | absence |
| Example 2-2 | BC | $B_{0.63}C_{0.37}$ | $B_{0.54}C_{0.46}$ | 27 | 0.14 | absence |
| Example 2-3 | BC | $B_{0.45}C_{0.55}$ | $B_{0.36}C_{0.64}$ | 22 | 0.14 | absence |
| Example 2-4 | BC | $B_{0.28}C_{0.72}$ | $B_{0.15}C_{0.85}$ | 16 | 0.16 | slightly peeled |
| Example 2-5 | BC | $B_{0.16}C_{0.84}$ | $B_{0.10}C_{0.90}$ | 13 | 0.15 | slightly peeled |
| Example 2-6 | BC | $B_{0.06}C_{0.94}$ | $B_{0.04}C_{0.96}$ | 11 | 0.16 | slightly peeled |
| Example 2-7 | BCH | $B_{0.80}C_{0.20}$ | $B_{0.66}C_{0.34}$ | 33 | 0.14 | absence |
| Example 2-8 | BCH | $B_{0.41}C_{0.59}$ | $B_{0.38}C_{0.62}$ | 36 | 0.14 | absence |
| Example 2-9 | BCH | $B_{0.22}C_{0.78}$ | $B_{0.13}C_{0.87}$ | 37 | 0.14 | absence |
| Example 2-10 | BCH | $B_{0.11}C_{0.89}$ | $B_{0.07}C_{0.93}$ | 38 | 0.14 | absence |
| Example 2-11 | BCN | $B_{0.45}C_{0.11}N_{0.44}$ | $B_{0.35}C_{0.32}N_{0.33}$ | 25 | 0.14 | absence |
| Example 2-12 | BCN | $B_{0.54}C_{0.33}N_{0.13}$ | $B_{0.45}C_{0.44}N_{0.11}$ | 24 | 0.14 | absence |
| Example 2-13 | BCN | $B_{0.44}C_{0.34}N_{0.21}$ | $B_{0.40}C_{0.41}N_{0.19}$ | 25 | 0.14 | absence |
| Example 2-14 | BCN | $B_{0.25}C_{0.50}N_{0.26}$ | $B_{0.19}C_{0.62}N_{0.19}$ | 22 | 0.14 | absence |
| Example 2-15 | BCN | $B_{0.18}C_{0.67}N_{0.15}$ | $B_{0.14}C_{0.75}N_{0.11}$ | 20 | 0.14 | absence |
| Example 2-16 | BCN | $B_{0.18}C_{0.70}N_{0.12}$ | $B_{0.14}C_{0.78}N_{0.08}$ | 19 | 0.14 | slightly peeled |
| Example 2-17 | BCN | $B_{0.09}C_{0.84}N_{0.07}$ | $B_{0.07}C_{0.88}N_{0.05}$ | 17 | 0.14 | slightly peeled |

TABLE 2-continued

| Section | Major element | Atomic concentration ratio of BCN Convex portion | Atomic concentration ratio of BCN Concave portion | Film hardness/ GPa | Friction coefficient | Film friction loss |
|---|---|---|---|---|---|---|
| Example 2-18 | BCNH | $B_{0.56}C_{0.31}N_{0.13}$ | $B_{0.48}C_{0.42}N_{0.10}$ | 25 | 0.14 | absence |
| Example 2-19 | BCNH | $B_{0.24}C_{0.52}N_{0.24}$ | $B_{0.21}C_{0.60}N_{0.19}$ | 25 | 0.14 | absence |
| Example 2-20 | BCNH | $B_{0.19}C_{0.69}N_{0.12}$ | $B_{0.17}C_{0.72}N_{0.11}$ | 26 | 0.14 | absence |
| Example 2-21 | BCNH | $B_{0.18}C_{0.74}N_{0.08}$ | $B_{0.16}C_{0.78}N_{0.06}$ | 27 | 0.14 | absence |
| Example 2-22 | BCNH | $B_{0.11}C_{0.80}N_{0.09}$ | $B_{0.09}C_{0.84}N_{0.07}$ | 30 | 0.14 | absence |
| Example 2-23 | BCNH | $B_{0.06}C_{0.90}N_{0.04}$ | $B_{0.04}C_{0.93}N_{0.03}$ | 36 | 0.14 | absence |
| Comp. Example 2-1 | C | $C_{1.00}$ | | 10 | 0.28 | entirely worn |
| Comp. Example 2-2 | CH | $C_{1.00}$ | | 40 | 0.21 | partially worn |
| Comp. Example 2-3 | BC (B, graphite) | $B_{0.58}C_{0.42}$ | | 4 | 0.38 | entirely worn |
| Comp. Example 2-4 | BCN (h-BN) | $B_{0.32}C_{0.36}N_{0.32}$ | | 12 | 0.31 | entirely worn |

What is claimed is:

1. A hard film containing boron and carbon,
wherein the hard film includes a plurality of concave portions and a plurality of convex portions formed on a surface of the hard film, the concave portions and the convex portions extend from the surface to a depth of 150 nm or less, and
wherein carbon concentration in the concave portion is higher than that in the convex portion and boron concentration in the convex portion is higher than that in the concave portion.

2. The hard film according to claim 1, wherein
the concave portion forms a groove in the surface and a plurality of the grooves are arranged.

3. The hard film according to claim 2, wherein
a plurality of clusters are formed on the surface, a plurality of the grooves are formed in the cluster and the plurality of the grooves is different in orientation for each cluster.

4. The hard film according to claim 2, wherein
the width of each of the plurality of the grooves is less than 100 μm, and the step between the concave portion and the convex portion is less than 0.5 μm.

5. The hard film according to claim 1, wherein
The hard film further contains at least one of hydrogen and nitrogen, the hydrogen being 20 atomic % or less, the nitrogen being less than 1.1 times the boron concentration.

6. The hard film according to claim 1, wherein
the hardness of the hard film is 20 Gpa or more.

7. A sliding part in which the hard film according to claim 1 is disposed over a substrate.

8. The sliding part according to claim 7, wherein
the hard film includes a plurality of intermediate layers formed on the side of the substrate, and the plurality of the intermediate layers comprise, from the side of the substrate, a first intermediate layer containing a metal, a second intermediate layer containing a metal and a metal carbide boride, and a third intermediate layer including a metal carbide boride and amorphous carbon.

9. The sliding part according to claim 7, wherein
the hard film includes an intermediate layer containing at least one of elements of silicon, chromium, titanium, and tungsten formed on the side of the substrate, the concentration of the element is decreased gradually from the substrate to the surface, and the concentration of at least one of elements of boron, carbon, and nitrogen is increased gradually from the substrate to the surface.

10. The sliding part according to claim 7, wherein
the substrate is any of a valve lifter, a tappet, an adjusting shim, a cam, a cam shaft, a rocker arm, a piston, a piston pin, a piston ring, a timing gear, and a timing chain disposed within an internal combustion engine, or any of an injector, a plunger, a cylinder, a cam, and a vane disposed in a fuel supply system.

11. The sliding part according to claim 8, wherein the substrate is any of a valve lifter, a tappet, an adjusting shim, a cam, a cam shaft, a rocker arm, a piston, a piston pin, a piston ring, a timing gear, and a timing chain disposed within an internal combustion engine, or any of an injector, a plunger, a cylinder, a cam, and a vane disposed in a fuel supply system.

12. The sliding part according to claim 9, wherein the substrate is any of a valve lifter, a tappet, an adjusting shim, a cam, a cam shaft, a rocker arm, a piston, a piston pin, a piston ring, a timing gear, and a timing chain disposed within an internal combustion engine, or any of an injector, a plunger, a cylinder, a cam, and a vane disposed in a fuel supply system.

* * * * *